United States Patent
Forrest et al.

(10) Patent No.: US 10,770,690 B2
(45) Date of Patent: Sep. 8, 2020

(54) OLED WITH MINIMAL PLASMONIC LOSSES

(71) Applicant: THE REGENTS OF THE UNIVERSITY OF MICHIGAN, Ann Arbor, MI (US)

(72) Inventors: Stephen R. Forrest, Ann Arbor, MI (US); Jongchan Kim, Ann Arbor, MI (US)

(73) Assignee: The Regents of The University of Michigan, Ann Arbor, MI (US)

(*) Notice: Subject to any disclaimer, the term of this patent is extended or adjusted under 35 U.S.C. 154(b) by 0 days.

(21) Appl. No.: 16/189,088

(22) Filed: Nov. 13, 2018

(65) Prior Publication Data

US 2019/0148674 A1 May 16, 2019

Related U.S. Application Data

(60) Provisional application No. 62/586,302, filed on Nov. 15, 2017.

(51) Int. Cl.
*H01L 51/52* (2006.01)
*G02B 5/02* (2006.01)

(52) U.S. Cl.
CPC ........ *H01L 51/5271* (2013.01); *G02B 5/0221* (2013.01); *G02B 5/0284* (2013.01); *H01L 2251/5315* (2013.01)

(58) Field of Classification Search
CPC ................... H01L 51/5271; H01L 2251/5315
See application file for complete search history.

(56) References Cited

U.S. PATENT DOCUMENTS

| | | | |
|---|---|---|---|
| 4,769,292 A | 9/1988 | Tang | |
| 5,247,190 A | 9/1993 | Friend | |
| 5,703,436 A | 12/1997 | Forrest | |
| 5,707,745 A | 1/1998 | Forrest | |
| 5,834,893 A | 11/1998 | Bulovic | |

(Continued)

FOREIGN PATENT DOCUMENTS

| | | | |
|---|---|---|---|
| WO | WO-0231026 A2 * | 4/2002 | ........... C08G 75/045 |
| WO | 2008057394 A1 | 5/2008 | |
| WO | 2010011390 A2 | 1/2010 | |

OTHER PUBLICATIONS

Baldo et al."Highly efficient phosphorescent emission from organic electroluminescent devices", Nature, vol. 395, pp. 151-154, 1998.

(Continued)

*Primary Examiner* — Mark W Tornow
(74) *Attorney, Agent, or Firm* — Butzel Long

(57) ABSTRACT

A top-emitting organic light emitting device (OLED) that comprises: a substrate having an inward side and an outward side; an OLED body that includes a transparent bottom electrode proximate to the inward side of the substrate, an organic emitting layer, and a transparent top electrode in that order; a non-metallic, diffuse reflective layer with a roughened top surface proximate to and facing the bottom transparent electrode; and a high refractive index waveguide layer. The diffuse reflective layer is positioned between the inward side of the substrate and the OLED body, and the waveguide layer is positioned between the diffuse layer and the bottom transparent electrode.

17 Claims, 11 Drawing Sheets

(56) References Cited

U.S. PATENT DOCUMENTS

| | | | |
|---|---|---|---|
| 5,844,363 | A | 12/1998 | Gu |
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,468,819 | B1 | 10/2002 | Kim |
| 7,279,704 | B2 | 10/2007 | Walters |
| 7,431,968 | B1 | 10/2008 | Shtein |
| 7,968,146 | B2 | 6/2011 | Wagner |
| 8,373,341 | B2 * | 2/2013 | Xue ................ H05B 33/22 313/504 |
| 9,331,299 | B2 | 5/2016 | Xu |
| 9,559,151 | B2 | 1/2017 | Hack |
| 9,577,221 | B2 | 2/2017 | Weaver |
| 9,655,199 | B2 | 5/2017 | Weaver |
| 2003/0230980 | A1 | 12/2003 | Forrest |
| 2004/0174116 | A1 | 9/2004 | Lu |
| 2004/0217702 | A1 * | 11/2004 | Garner ............ H01L 51/5262 313/512 |
| 2012/0061707 | A1 * | 3/2012 | Seo ................ H01L 51/5275 257/98 |
| 2016/0254492 | A1 * | 9/2016 | Wu ................. H01L 51/5262 257/40 |
| 2018/0097202 | A1 | 4/2018 | Forrest |
| 2019/0081248 | A1 | 3/2019 | Lin |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Forrest, S.R.; et al., "Small Molecular Weight Organic Thin-Film Photodetectors and Solar Cells" in J. Appl. Phys. 2003, 93 (7), 3693-3723.

Chance, R.R.; et al., "Lifetime of an Emitting Molecule near a Partially Reflecting Surface" in J. Chem. Phys. 1974, 60 (7), 2744-2748.

Baldo, M.A.; et al., "Simplified Calculation of Dipole Energy Transport in a Multilayer Stack Using Dyadic Green's Functions" in Opt. Express 2007, 15 (4), 1762-1772.

Bulović, V.; et al., "Weak Microcavity Effects in Organic Light-Emitting Devices", Phys. Rev. B: Condens. Matter Mater. Phys. 1998, 58 (7), 3730-3740.

Koenderink, J.J.; et al., "Diffuse and Specular Reflectance from Rough Surfaces" in Appl. Opt. 1998, 37 (1), 130-139).

Wang, Z. B.; et al., "Unlocking the Full Potential of Organic Light-Emitting Diodes on Flexible Plastic" in Nat. Photonics 2011, 5 (12), 753-757).

Ou, Q.; et al., "Extremely Efficient White Organic Light-Emitting Diodes for General Lighting" in Adv. Funct. Mater. 2014, 24 (46), 7249-7256).

Koh, et al., "Enhanced Outcoupling in Organic Light-Emitting Diodes via a High-Index Contrast Scattering Layer", in ACS Photonics 2015, 2 (9), 1366-1372).

Mladenovski, S.; et al.; "Exceptionally Efficient Organic Light Emitting Devices Using High Refractive Index Substrates" in Opt. Express 2009, 17 (9), 7562-7570.

Forrest, S.R.; et al., "Enhancing Waveguided Light Extraction in Organic LEDs Using an Ultra-Low-Index Grid", in Opt. Lett. 2010, 35 (7), 1052-1054.

Forrest, S.R.; et al., "Organic Light Emitting Devices with Enhanced Outcoupling via Microlenses Fabricated by Imprint Lithography", in J. Appl. Phys. 2006, 100 (7), 73106.

\* cited by examiner

OLED WITH MINIMAL PLASMONIC LOSSES

CROSS-REFERENCE TO RELATED APPLICATIONS

This application claims priority under 35 U.S.C. § 119(e) to U.S. Provisional Application No. 62/586,302, filed Nov. 15, 2017, the entire contents of which are incorporated herein by reference.

GOVERNMENT RIGHTS

This invention was made with government support under Award No. DE-EE0007626 awarded by Office of Energy Efficiency and Renewable Energy (EERE) and United States Department of Energy. The government has certain rights in the invention.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and Universal Display Corporation. The agreement was in effect on and before the effective filing date of the presently claimed invention, and the claimed invention was made as a result of activities undertaken within the scope of the agreement.

FIELD OF INVENTION

The present invention relates to methods of enhancing outcoupling in organic light emitting devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted Ir(ppy)$_3$, which has the following structure:

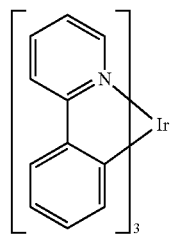

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

Industry standards for such a display call for pixels adapted to emit particular colors, referred to as "saturated" colors. In particular, these standards call for saturated red, green, and blue pixels. Color may be measured using CIE coordinates well known and recognized in the art of lighting and displays. Alternatively, an OLED can be designed to emit white light, that is, light from two or more emitter dopants, e.g., three different color emitter dopants, combine to provide across most of the visible spectrum. One possible objective of a white OLED would be to provide light that mimics sunlight minus much of the strong UV. Accordingly, one can foresee a low cost, low power, high efficiency alternative to traditional incandescent lighting devices as well as light from LEDs. The white OLED can be either a single EML device or a stack structure. See, for example, U.S. Pat. Nos. 9,331,299; 9,559,151; 9,577,221; and 9,655,199, each of which is assigned to Universal Display Corporation (UDC), and each of which is incorporated by reference in its entirety.

Phosphorescent organic light-emitting devices (PHOLEDs) can achieve 100% internal quantum efficiency, however a considerable amount of this generated light is lost within the device structure due to the excitation of substrate, waveguide, and surface plasmon polariton (SPP) modes. Substrate modes can be efficiently outcoupled by structuring the air-substrate interface such as by using microlens arrays. See, Forrest, S. R.; et al., "*Organic Light Emitting Devices with Enhanced Outcoupling via Microlenses Fabricated by Imprint Lithography*", in *J. Appl. Phys.* 2006, 100 (7), 73106. The major loss channels for trapped light beyond the modes trapped in the substrate are waveguide modes and SPPs. The optical power trapped inside the active region excites two different modes: the waveguide mode (power guided within the organic layer and transparent anode), and SPPs consisting of power confined at the metal/organic interface. Waveguide modes propagate tens of micrometers and can be efficiently scattered out of the device with appropriate outcoupling structures. In contrast, SPP modes are excited primarily in the metal cathode, propagate only a few micrometers, and dissipate before scattering, and therefore, results in an important and unsolved optical loss mechanism.

Loss of light output due to waveguide and SPP modes, which is typically greater than 50% in conventional OLEDs, remains a significant hurdle. Several methods such as sub-anode structures (see, Forrest, S. R.; et al., "*Enhancing Waveguided Light Extraction in Organic LEDs Using an Ultra-Low-Index Grid*", in *Opt. Lett.* 2010, 35 (7), 1052-1054), high refractive index substrates (see, Mladenovski, S.; et al.; "Exceptionally Efficient Organic Light Emitting Devices Using High Refractive Index Substrates" in *Opt. Express* 2009, 17 (9), 7562-7570), scattering layers, (see, Koh, T. W.; et al., "*Enhanced Outcoupling in Organic Light-Emitting Diodes via a High-Index Contrast Scattering Layer*", in *ACS Photonics* 2015, 2 (9), 1366-1372), corrugated structures, (see, Ou, Q.; et al., "*Extremely Efficient White Organic Light-Emitting Diodes for General Lighting*" in *Adv. Funct. Mater.* 2014, 24 (46), 7249-7256), Bragg scatterers, and microcavities (see, Wang, Z. B.; et al., "*Unlocking the Full Potential of Organic Light-Emitting Diodes on Flexible Plastic*" in *Nat. Photonics* 2011, 5 (12), 753-757) have been demonstrated to overcome these losses, although near-field coupling into SPP modes by the metal electrode is more difficult to avoid.

In particular, top-emitting OLEDs efficiently excite both waveguide and SPP modes due to the strong optical cavity formed between the high reflectivity semitransparent top electrode and the thick metallic bottom electrode. Several strategies such as thick electron transport layers, metallic grids, and periodically corrugated metal electrodes can help enhance light output. However, these methods are often wavelength and viewing-angle dependent, and they can be challenging to apply over large substrate areas.

SUMMARY OF THE INVENTION

A top-emitting organic light emitting device (OLED) that comprises: a substrate having an inward side and an outward side; an OLED body that includes a transparent bottom electrode proximate to the inward side of the substrate, an organic emitting layer, and a transparent top electrode in that order; a non-metallic, diffuse reflective layer with a roughened top surface proximate to and facing the bottom transparent electrode; and a high refractive index waveguide layer. The diffuse reflective layer is positioned between the inward side of the substrate and the OLED body, and the waveguide layer is positioned between the diffuse layer and the bottom transparent electrode.

DETAILED DESCRIPTION

Figure 1:
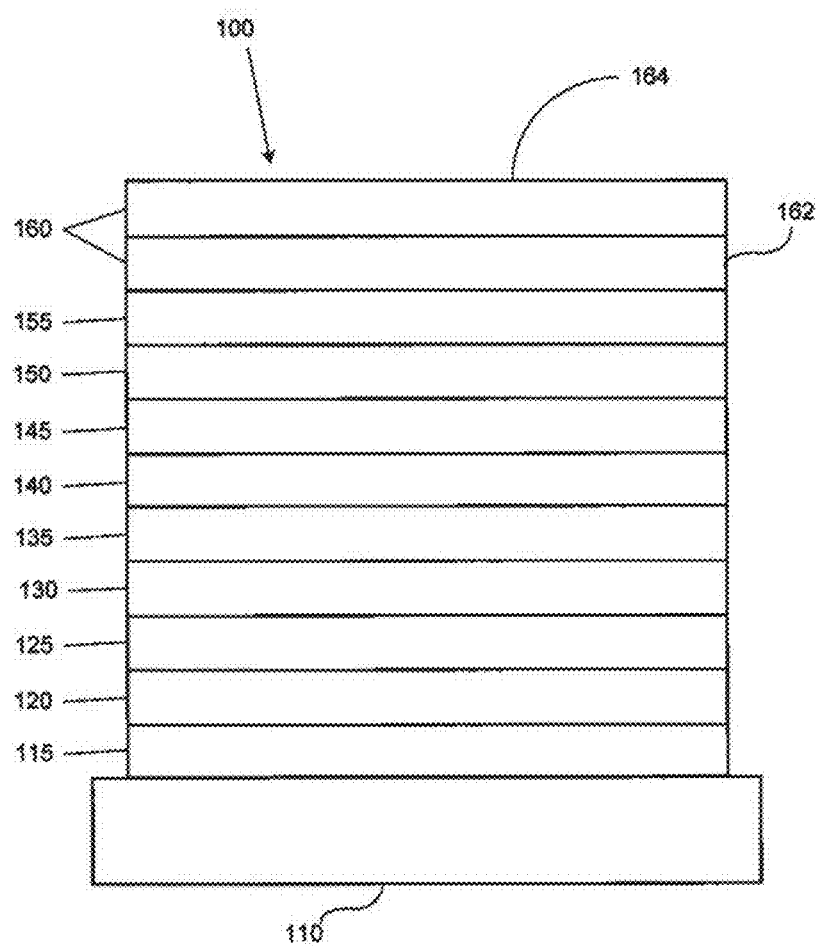
FIG. 1 shows an organic light emitting device.

The term "transparent" is defined by a transmission of light of at least 80% through a subject material of a given thickness compared to a reference material of indium tin oxide of the same thickness set at 100% transmission.

The total external quantum efficiency (EQE), which is the product of the internal quantum efficiency (IQE) and the outcoupling efficiency ($\eta_{out}$), is regarded as one of the critical parameters for a light-emitting device because it describes the amount of emitted photons (or light) per unit of electrical energy supplied to the device. As noted above, the inherent layered structure of OLEDs causes a low outcoupling efficiency since generated photons become trapped in waveguide modes and are wasted in the excitation of SPPs. For example, the external quantum efficiency (EQE) of current OLEDs lies around 20% with conventional glass substrates, i.e., in the absence of outcoupling enhancements.

It remains a challenge to develop a highly efficient outcoupling system for organic light-emitting diodes (OLEDs) that is independent of wavelength and viewing angle. Moreover, many outcoupling systems known to maximize light output can be as intrusive from a manufacturing perspective. To address this technical hurtle we describe a transparent, top emitting OLED integrated with a relatively high index of refraction waveguide layer and a dielectric diffuse reflector with a roughened surface to minimize plasmonic, waveguide and substrate modes. Moreover, we observe that the above integrated structure can minimize the wavelength and viewing-angle dependent characteristics of previously known outcoupling structures. We find that our integrated outcoupling structure can increase the external quantum efficiency, e.g., from 15±2% to 37±4%, compared to an analogous designed top-emitting OLED with an Al mirror. This corresponds to at least a 2.5-fold output enhancement in the absence of additional outcoupling structures such as microlens arrays or index matching layers to extract substrate modes. Perhaps, more importantly, the integrated structure is a low cost solution for solid-state OLED lighting due to its manufacturing simplicity and high outcoupling efficiency.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
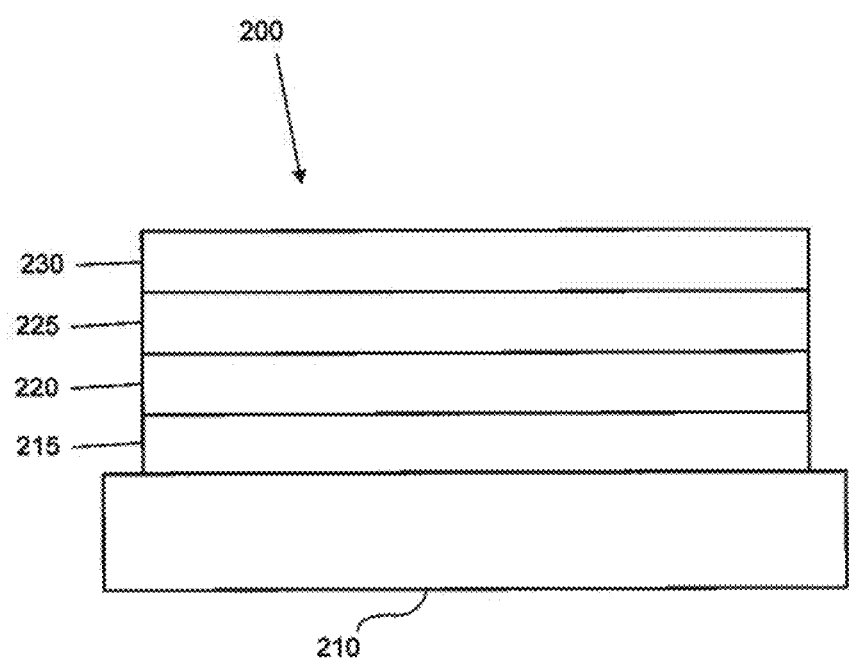
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

In one embodiment, we describe a top-emitting organic light emitting device (OLED) that comprises: a substrate having an inward side and an outward side; an OLED body that includes a transparent bottom electrode proximate to the inward side of the substrate, an organic emitting layer, and a transparent top electrode in that order; a non-metallic, diffuse reflective layer with a roughened top surface proximate to and facing the bottom transparent electrode; and a high refractive index waveguide layer. The diffuse reflective layer is positioned between the inward side of the substrate and the OLED body, and the waveguide layer is positioned between the diffuse reflective layer and the bottom transparent electrode.

We identify the outcoupling structure as an integrated structure because we believe the diffuse reflective layer together with the high refractive index waveguide layer can provide at least a 1.5 fold enhancement of light outcoupling efficiency to the top-emitting OLED relative to a corresponding top-emitting OLED with an Al mirror positioned between an inward side of the substrate and the OLED body. In one embodiment, we measured the light coupling efficiency with a top-emitting OLED having a light emitting layer that included Ir(ppy)$_2$(acac), which has a characteristic emissive peak at about 530 nm. In some instances, we can observe at least a 2.0 fold enhancement of light outcoupling efficiency. In another embodiment, we can measure the light outcoupling efficiency of a top-emitting white OLED, e.g., one that can be used in commercial or residential lighting systems, with the integrated diffuse reflective layer and the high refractive index waveguide layer to have at least a 1.3 fold enhancement of light outcoupling efficiency relative to a corresponding top-emitting OLED with an Al mirror positioned between an inward side of the substrate and the OLED body. In some instances, this white OLED can have a 1.7 fold enhancement of light outcoupling efficiency.

To reduce the optical loss due to SPP modes a metal mirror (e.g., silver, aluminum) in an OLED or white OLED is replaced with the integrated outcoupling structure above. Diffuse reflection can be described as a light reflection mechanism in which an incident ray is scattered at many angles, opposed to specular reflection which reflects light in one direction such as with a smooth surface mirror. The advantages of employing diffusive reflection are as follows:

1. To minimize or completely eliminate SPP modes within the device;
2. To remove energy dissipation due to the metal absorption; and
3. Provide a weaker cavity mode leading to much less angular dependence and enhanced outcoupling of the device. In addition, because the integrated system of a diffuse reflector and high refractive index waveguide layer demonstrates output performance along the entire visible spectrum, the device structure described is optimal for white OLEDs.

Figure 3:
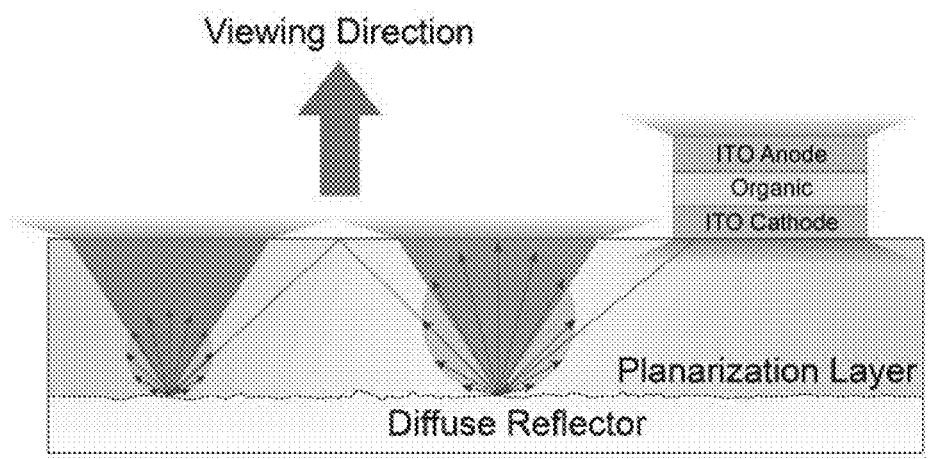
FIG. 3 is a schematic cross-section of a top-emitting green OLED with an integrated outcoupling system.

FIG. 3 is a schematic cross-section of a top-emitting green OLED with an integrated outcoupling system described. As exemplified, the surface of the diffuse reflector has a root mean square roughness of about 6.7 μm (measured by profilometry), and is planarized with a transparent, high refractive index material, e.g., polymer, waveguide. The light emitted from the OLED is either directly emitted from the top surface into the viewing direction, or enters the waveguide layer where it propagates until it is incident on the roughened reflector surface. There, the light is scattered into a Lambertian profile (see, Koenderink, J. J.; et al., "*Diffuse and Specular Reflectance from Rough Surfaces*" in *Appl. Opt.* 1998, 37 (1), 130-139), and light within the emission cone exits into the viewing direction. Light incident at angles greater than that for total internal reflection at a polymer-air interface is returned to the diffuse reflector where it is scattered once again. This repeats until the light is either absorbed or scattered into the viewing direction. A material that has a very low absorption loss even after multiple reflections is selected for the diffuse reflective layer, e.g., PTFE. The low absorption allows for multiple iterations of light scattering until the light is extracted out of the device.

Of course, the diffuse reflective layer can have a roughened top surface other than the value exemplified above. In most instances, the root mean-square roughness of the diffuse reflector will be in a range from 0.5 μm to 50 μm. In other instances, the root mean-square roughness will be in a range from 1 μm to 25 μm, and in still another instance, the root mean-square roughness will be in a range from 1 μm to 15 μm. Moreover, the materials that can be used as a diffuse reflective layer are not limited to PTFE, but include other materials known to those of ordinary skill in the art.

In an optimal diffuse reflector, the ratio of incident to scattered light power towards the viewing direction from a single diffuse reflection ($R_S$) is determined using Snell's law, viz. $R_S=(n_{air}/n_P)^2$, where $n_{air}$ and $n_P$ are the refractive indices of the air and waveguide layer, respectively. Accordingly, the ratio of the light intensity extracted into the viewing direction to that within waveguide layer ($\eta_D$) following the path shown above can be defined by eq. (1).

$$\eta_D = R_S + (1-R_S) \cdot R_S + (1-R_S)^2 \cdot R_S + \ldots = \sum_{n=0}^{\infty}(1-R_S)^n \cdot R_S = 1 \quad (1)$$

In practice, absorption and reflection losses must be taken into account. To quantify the importance of these effects, one can use ray tracing to calculate $\eta_D$ as a function of waveguide layer thickness and absorption coefficient ($\alpha$), assuming 5% loss at each reflection. As expected, the $\eta_D$ increases as absorption and reflection losses are reduced. The only loss channel in this case is the light propagating to the substrate edge; <0.1% for the (2.5 cm)² substrate used in the simulation. The outcoupling efficiency ($\eta_{out}$) of the OLED is defined by eq. (2).

$$\eta_{out} = \eta_{TA} + \eta_D \eta_S \quad (2)$$

where $\eta_{TA}$ is the fraction of light emitted from the top surface and $\eta_S$ is the fraction of light coupled into the slab waveguide. The simulated modal power intensity of both top and bottom OLED emission as a function of the normalized in-plane wave vector $u=k_\parallel/(n_{EML} \cdot k_0)$ (here $k_\parallel$ is the wave vector of the dipole radiation field in the plane of the interface, $k_0$ is the wave vector in vacuum, and $n_{EML}$ is the refractive index of the organic layer) of the cavity at different waveguide layer refractive indices ($n_P$) at the wavelength of $\lambda=530$ nm. Top emission power propagating with wave vectors $0<u<n_{air}/n_{EML}$, is emitted into the viewing direction (air modes). Modal power with wave vectors of $n_{air}/n_{EML}<u<n_P/n_{EML}$ is totally internally reflected at the air-top electrode interface. It is subsequently incident on the waveguide layer (substrate modes). All the bottom emitted power propagating with wave vectors $0<u<n_P/n_{EML}$ couples into the waveguide. For $n_P/n_{EML}<u<1$, both top and bottom emission propagates within the OLED active layer. Note that no power exists at $u>1$, which corresponds to the power coupled into SPP modes.

Figure 4A:
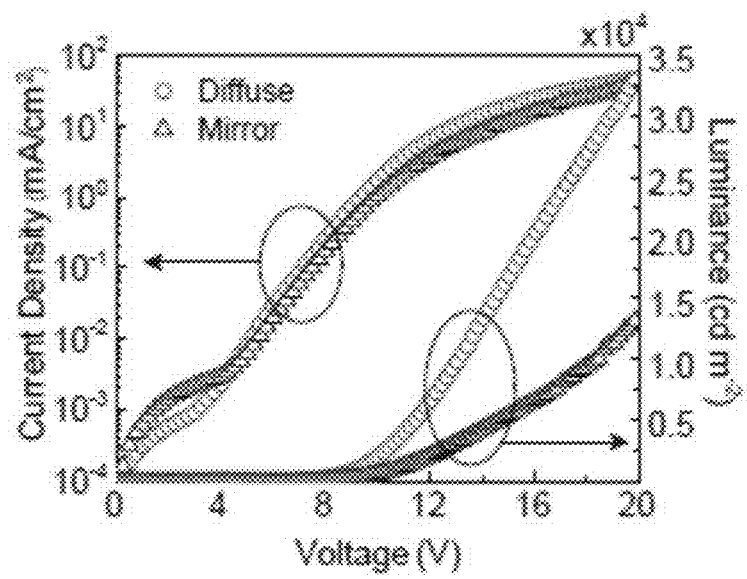
FIG. 4A is a current density-voltage-luminescence plot of a green OLED with an integrated outcoupling structure of the invention in comparison to the same green OLED but with an Al mirror.
Figure 4B:
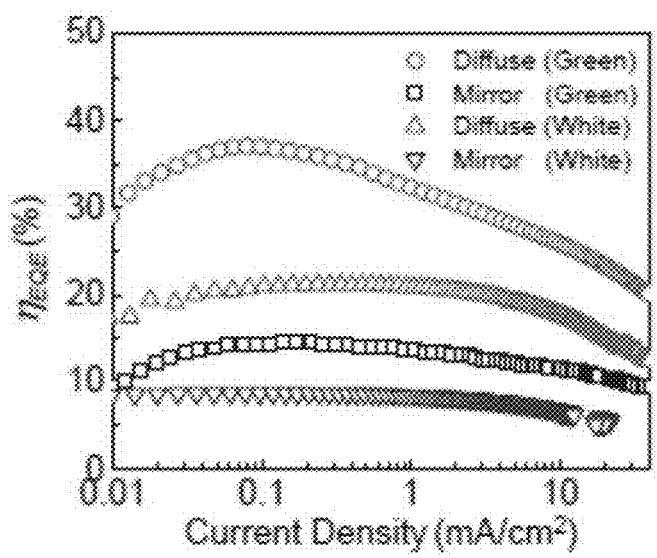
FIG. 4B are external quantum efficiency ($\eta_{EQE}$) vs. current density plots for green OLED and white OLED, each compared to a similar green or white OLED but with an Al mirror.

To demonstrate the enhancement in external quantum efficiency ($\eta_{EQE}$), green and white PHOLEDs with transparent top and bottom contacts were grown on diffuse and metal reflectors. FIGS. 4A and 4B are plots of the current density-voltage (J-V) and external quantum efficiency characteristics of the OLEDs of the invention in comparison to similar constructed OLEDs but with an Al mirror, see, Experimental. In FIG. 4A, the near-identical J-V plots of the green inventive OLED and the OLED with an Al mirror shows that there is little, if any, or no loss in operating performance of the green OLED with the integrated outcoupling structure. The green, diffuse reflecting OLED demonstrates a peak $\eta_{EQE}=37\pm4\%$, whereas with a corresponding (comparative) green OLED with an Al mirror, $\eta_{EQE}=15\pm2\%$. A similar enhancement is observed for the white-emitting OLED where $\eta_{EQE}=21\pm3\%$ for the white OLED with the inventive outcoupling structure compared with $9\pm1\%$ for comparative WOLED with an Al mirror, FIG. 4B.

Figure 5:
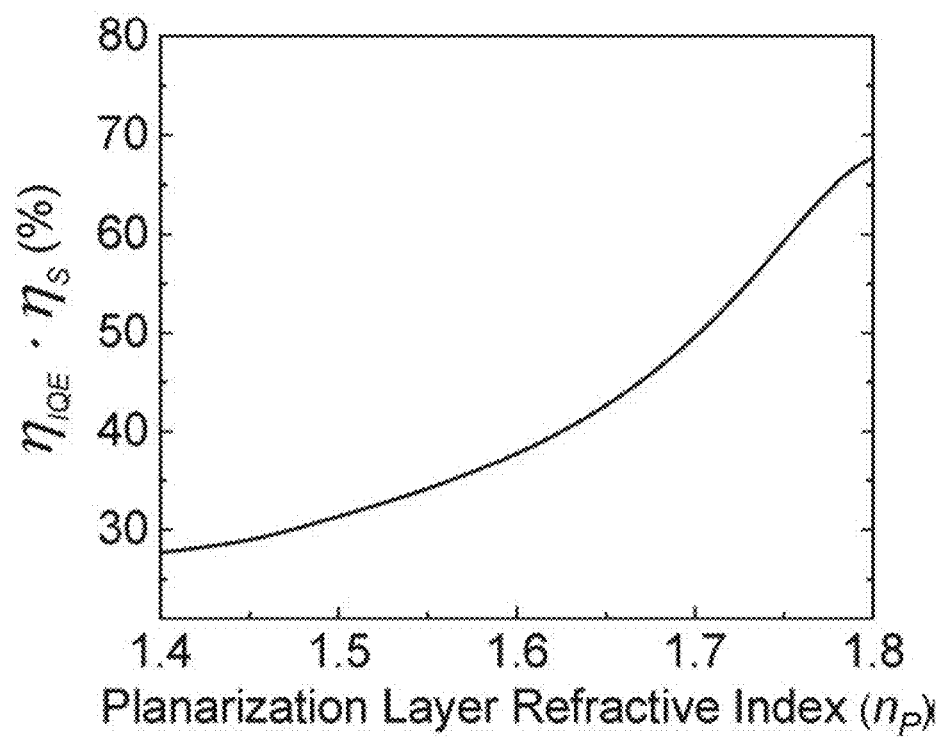
FIG. 5 is a plot of calculated coupling efficiency into a waveguide layer ($\eta_S$) as a function of waveguide refractive index ($\eta_P$).

The ability of the diffuse reflector to outcouple guided modes was quantified by comparing its performance with that of a green electrophosphorescent OLED fabricated on a sapphire substrate with a similar refractive index of $n_{saph}=1.77$ at $\lambda=530$ nm. The sapphire substrate yields $\eta_{IQE} \cdot \eta_{TA}=7\pm2\%$, where $\eta_{IQE}$ refers to the internal quantum efficiency. Therefore, from Eq. (2), the light coupled into the waveguide layer shows an outcoupling efficiency of $\eta_{IQE} \cdot \eta_S \cdot \eta_D=30\pm5\%$ and $8\pm3\%$ for the diffuser and metal mirror structures, respectively, resulting in a $3.8\pm1.5$ fold increase in extraction into the viewing direction via diffuse scattering. As indicated in FIG. 5, $\eta_{IQE} \cdot \eta_S=67\%$ for $n_P=1.8$, yielding $\eta_D=45\%$ and 12% for diffuse and Al mirror substrates, respectively. This corresponds to the ray tracing result in of $\eta_D=49\pm6\%$ for $\alpha=0.4\pm0.1$ mm$^{-1}$ and a thickness $240\pm9$ μm measured for the waveguide (data point), compared to $\eta_D=15\pm1\%$ for the $20\pm1$ μm thick waveguide used for the metal mirror reflector. These results are summarized in Table 1.

TABLE 1

Modal power distribution of scattering and specular (metal) reflector substrates.

|  |  | Diffuse Reflector | Metal Reflector |
|---|---|---|---|
| $\eta_{EQE}$[a] |  | 37 ± 4% | 15 ± 2% |
| $\eta_{IQE} \cdot \eta_{TA}$[†] |  | 7 ± 2% | 7 ± 2% |
|  | Active Area | 14 ± 5% |  |
| $\eta_{IQE} \cdot \eta_S \cdot \eta_D$ |  | 30 ± 5% | 8 ± 3% |
|  | Periphery | 16 ± 2% |  |
| $\eta_S$[†] |  | 67% | 67% |
| $\eta_D$[‡] |  | 45% (49%) | 12% (15%) |

Figure 6A:
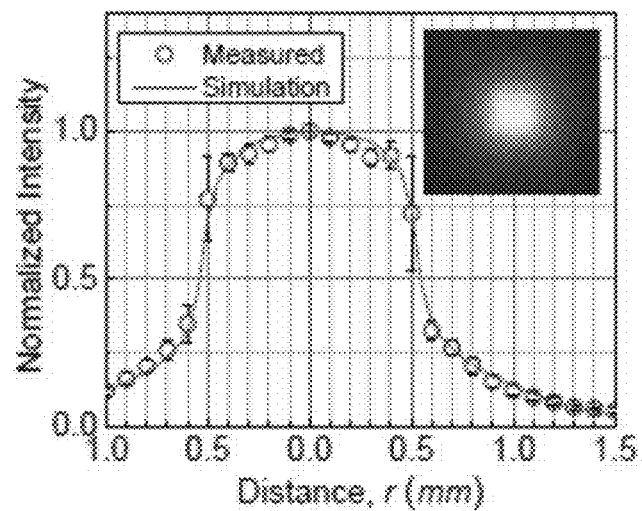
FIG. 6A is a plot of measured and simulated (ray tracing) peripheral emission from a PHOLED with the integrated outcoupling structure of the invention.
Figure 6B:
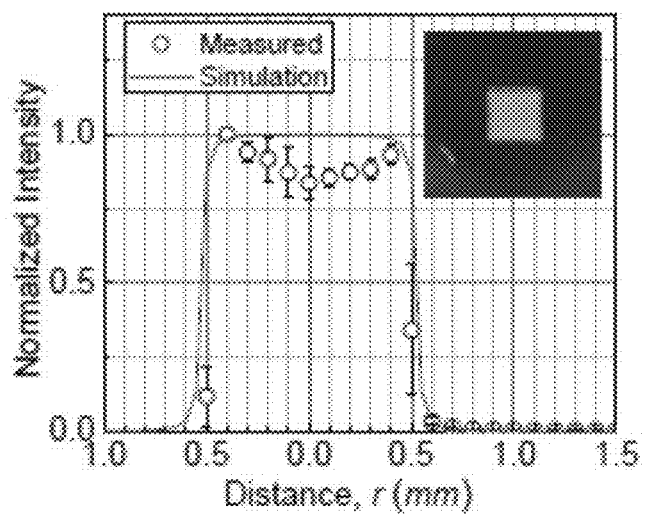
FIG. 6B is a plot of measured and simulated (ray tracing) peripheral emission from a comparative PHOLED with an AL mirror.

[a]Measured
[†]Calculated based on Green's function analysis.
[‡]Combined result from experiment and Green's function analysis. The result in parenthesis is from ray tracing analysis FIG. 6A shows the peripheral emission for a PHOLED with an integrated outcoupling structure of the invention is measured using a radial intensity profile across the device along with a simulation fit using ray tracing. FIG. 6B shows the peripheral emission (measured and simulated) for a comparative PHOLED with an Al mirror. In both devices the index of refraction at the top surface of the optical cavity changes from the ITO contact ($n_{ITO}=2.1$) to the waveguide layer ($n_P=1.8$), resulting in the emission peaks at the device edges in FIG. 6B. A summation of the radiated power outside the device active area indicates that 54% of the total emission is beyond the contact periphery in the inventive device. In contrast, the comparative device indicates that less than 10% of emission outside the contact periphery. As one would expect, the fraction of peripheral emission decreases with device area in the inventive device. Moreover, for device areas greater than 20 mm², $\eta_D$ was reduced due to the waveguided emission reaching the substrate edge. The fraction of peripheral emission decreases with increased device area, resulting in the loss of only an insignificant fraction of the light in the waveguide layer at the substrate edge for large area devices.

Figure 7A:
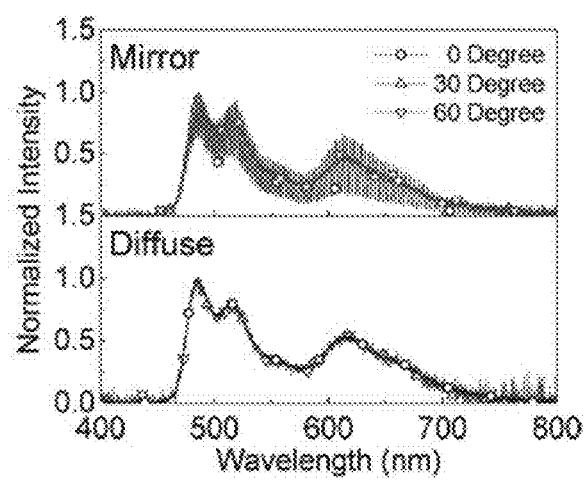
FIG. 7A shows a visible spectrum of an inventive device with a diffuse reflector and a comparative device with a mirrored substrate.
Figure 7B:
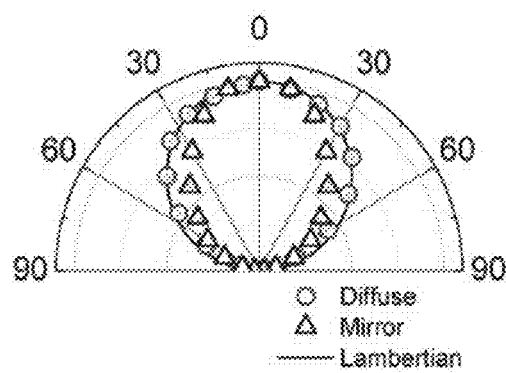
FIG. 7B shows light scattering by the diffuse reflector results in a Lambertian emission profile.

The spectrum of a conventional PHOLED depends on viewing angle due to weak optical microcavity effects. See, Bulović, V.; et al., "*Weak Microcavity Effects in Organic Light-Emitting Devices*", Phys. Rev. B: Condens. Matter Mater. Phys. 1998, 58 (7), 3730-3740. Bulović measured the angular distribution of the radiant intensity and showed that the spectral shift in a green OLED exhibits a peak shift of approximately 30-40 nm depending on the device structure. Cavity effects are more pronounced for top emitting OLEDs due to the large difference in the refractive index between the transparent ITO top contact and air. This effect is especially critical for white light sources due to their broad spectra. The use of a high refractive index waveguide layer suppresses spectral shifts at large viewing angles, thus reducing cavity effects. As a result, the spectrum of the devices with a mirrored substrate as well as a substrate with a diffuse reflector of the invention demonstrate an independence of viewing angle, as shown in FIG. 7A. However, the spectrum of the mirrored device measured perpendicular to the substrate (0°) shows Fabry-Perot resonances due to the interference within the waveguide layer. In contrast, the inventive device with a diffuse reflector will tend to scatter light in all directions, and thereby, eliminate most if not nearly all of Fabry-Perot resonances. Furthermore, scattering by the diffuse reflector results in a Lambertian emission profile, shown in FIG. 7B.

The thickness of the waveguide affects the power lost via absorption. The ray tracing simulations show that $\eta_D$ can approach 75% for a 50 µm thick waveguide layer at $\alpha=0.4$ mm$^{-1}$, leading to $\eta_{EQE}=68\%$ with 100% device internal quantum efficiency. From this we infer a 3.4-fold enhancement compared to the substrate with the metal mirror. The emission profile also depends on the waveguide layer thickness. This results since more reflections occur during lateral propagation in a thinner waveguide layer. A 50 µm waveguide layer is expected to show a peripheral emission of 13%.

In one embodiment, the high refractive index waveguide layer is a polymer with a refractive index in a range from 1.6 to 2.1.

Described above is an efficient, transparent top emitting structure with a diffuse reflector planarized by a transparent slab waveguide. The diffuse reflector eliminates losses due to coupling to SPP modes, while redirecting the laterally propagating light within the waveguide layer into the viewing direction. The planarizing, high refractive index polymer waveguide, for example, a polymer of $n_P=1.8$, is deposited onto the diffuse reflector surface to maximize the light coupled into the diffuser. Moreover, the planarizing waveguide creates a smooth surface on which one can fabricate an OLED body. The resulting device architecture does not necessarily require additional outcoupling structures such as microlens arrays to enhance the outcoupling efficiency, but of course, one can optionally add such an outcoupling array to provide even greater outcoupling efficiencies. The diffuse reflector shows no wavelength or viewing angle dependence, exhibiting a Lambertian emission profile.

Diffuse Reflector

To observe and achieve diffusive reflection it is very important that a material for the back diffuse reflector be selected that absorbs little, if any, light at the target wavelength as the light approaches the surface. Instead, most of the light approaching the surface will be reflected in random directions. An exemplary list of reflector materials can be selected from polytetrafluoroethylene (PTFE), polyethylene terephthalate (PET), and barium sulfate. Of course, other known materials with similar reflective properties can be used as a diffuse reflector material. In many instances, the reflector material can be vapor on a roughened surface of a substrate, deposited on a substrate and cured with a roughened surface, or applied to a substrate as a roughened laminated film. In each instance, the method of making a diffuse reflector layer with a roughened surface is well known in the light-emitting device art.

In one embodiment, the diffuse reflective layer is positioned at a distance of at least 100 nm from the organic emissive layer. In another embodiment, the substrate is corrugated and the pattern of corrugation extends to the diffuse reflective layer.

Given that the output of blue or deep blue light from an OLED, particularly if the blue emitter is a phosphorescent emitter, remains a technical challenge, it is advantageous if the material selected as a back diffuse reflector is a material that absorbs very little, if any, light having a wavelength from 440 nm to 540 nm. Accordingly, in one embodiment the diffuse reflector will be a material that absorbs less than 15%, preferably less than 10%, of light within this wavelength range. The ideal wavelength to measure absorbance (or reflectivity) for such a material is 490 nm.

Figure 8A:
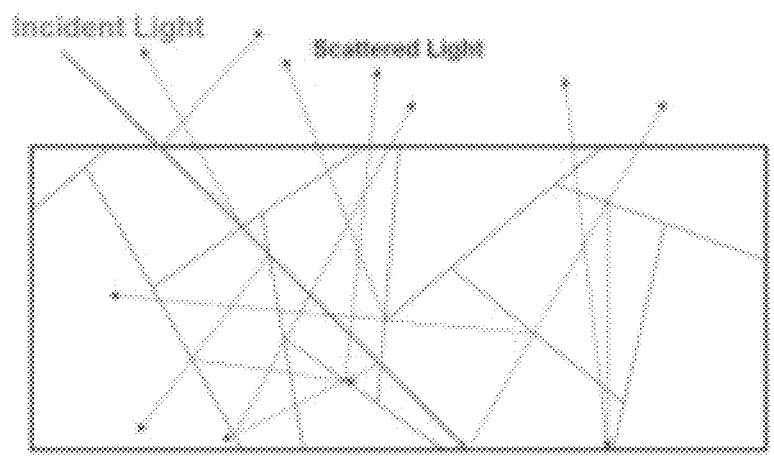
FIG. 8A and FIG. 8B are schematic representations of diffuse reflections.
Figure 8B:
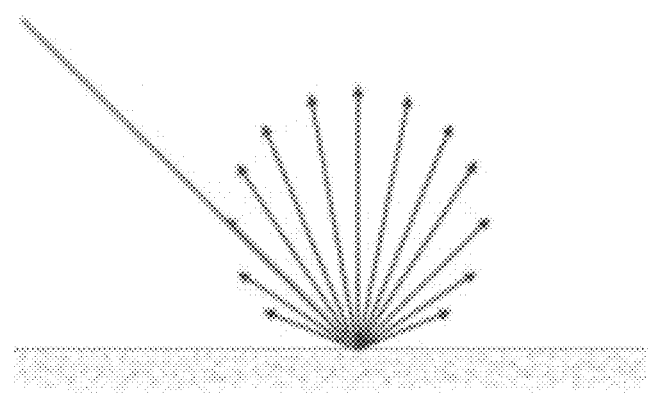

The back diffuse reflector can also have irregular interfaces beneath the layer so that each of the irregular interfaces can result in a reflection. FIG. 8A is a schematic representation of light reflection in a diffuse reflection layer. The incident light is reflected in each interface in the layer, and because there is negligible absorption within the layer the light will scatter as shown and eventually leave the device. FIG. 8B is a schematic representation of diffuse reflection from a diffuse reflection surface. Here, the length of the arrows represents the luminous intensity, which varies respect to the Labert's cosine law for an ideal diffuse reflector.

Figure 9:
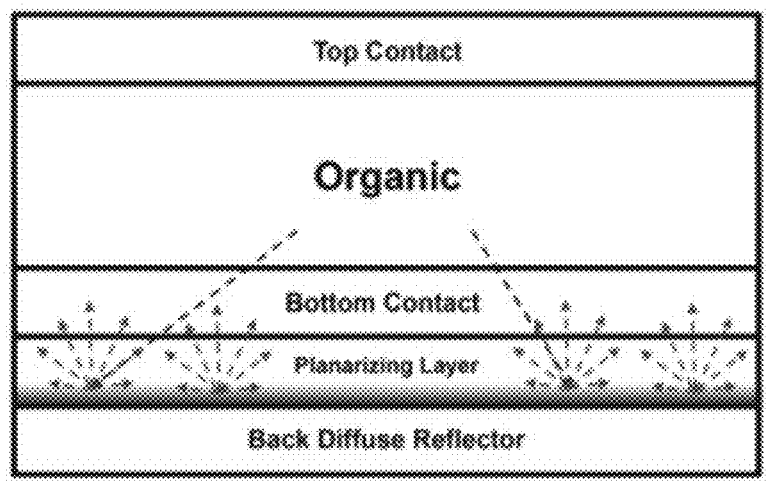
FIG. 9 is a representation of an integrated outcoupling structure with a diffuse reflective layer and a high refractive index waveguide (planarizing) layer.

FIG. 9 is a representation of an OLED device structure that includes an integrated outcoupling structure of a diffuse reflector with a high refractive index waveguide layer, and a transparent OLED body positioned above the outcoupling structure. The diffuse reflector layer is disposed on a substrate followed by a planarizing waveguide layer, e.g., a transparent polymeric material, a bottom transparent contact (electrode), the OLED body, and a top transparent contact (electrode). In one embodiment, indium zinc oxide (IZO), and an optional layer of MoO$_x$, can be used as a transparent material for both an anode and a cathode. To ensure that there is no confined light between the organic layer and planarizing waveguide layer, it can be advantageous for both materials, i.e., an organic layer of the OLED body and waveguide polymer, to have a similar refractive index, that is, a refractive index within 0.5, preferably within 0.3, of an organic layer of the OLED body. One may deposit a high refractive index polymer. or simply deposit a small molecule organic layer, as the planarizing waveguide layer.

Figure 10:
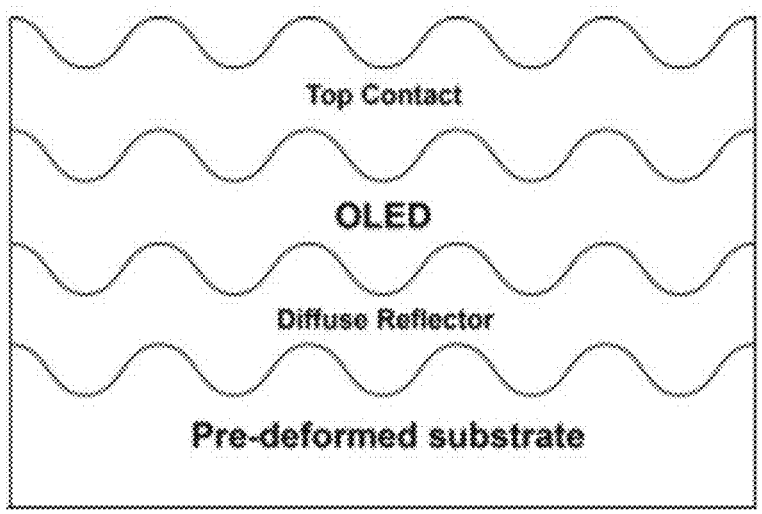
FIG. 10 is a representation of an integrated outcoupling structure with a diffuse reflective layer (shown with a high refractive index waveguide layer) positioned on a pre-deformed corrugated substrate.

FIG. 10 is a representation of an integrated outcoupling system positioned on a corrugated substrate or a corrugated organic light scattering layer that is disposed atop a relatively planar substrate. One could apply the diffuse reflector material by spin or dip coating to the corrugated structure. An example of a corrugated substrate, and methods of making such substrates, are described in U.S. patent application publication no. 2018/0097202 filed Oct. 3, 2017, and assigned to the Regents of the University of Michigan, the entire disclosure of which is incorporated herein by reference. Infra.

Figure 11:
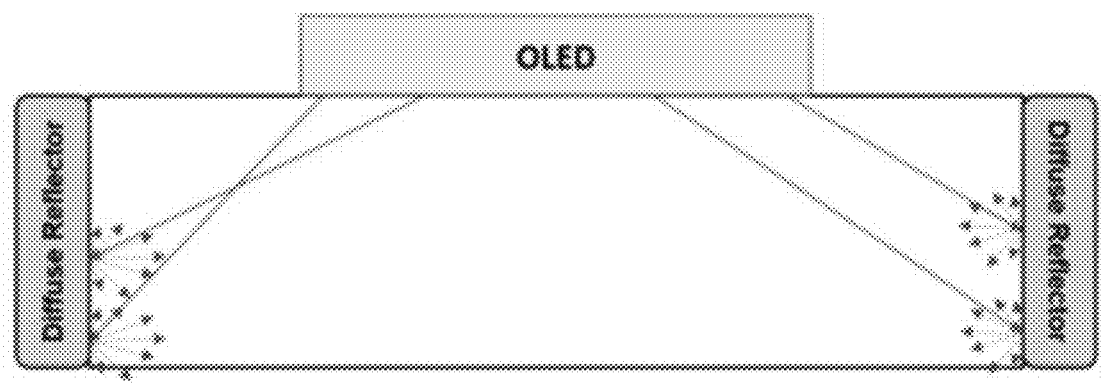
FIG. 11 is a representation of a diffuse reflector applied on an edge for a bottom emitting OLED.

For bottom illuminating OLEDs, light coupled to the glass modes is an issue. Also, light traveling within the glass substrate takes 20-30% of the total emission from the OLED. Thus, extracting this glass mode is another challenge for the bottom emitting OLEDs. FIG. 11 is a representation of a diffuse reflector layer applied on an edge for a bottom emitting OLED. To extract the guided glass modes out to the air, the light is reflected back at the edge of the device when the edge of the glass is coated with a diffuse reflector material. By adding a diffuse reflector on the edge of a glass substrate, one can block light from exiting a side of a device, and therefore, achieve an increased efficiency for a bottom emitting OLED.

Figure 12:
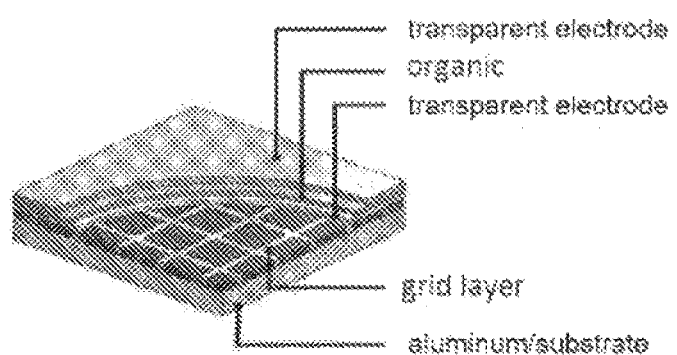
FIG. 12 is a representation of a WOLED with an aluminum substrate and a sub-anode 2D TiO2 grid for outcoupling waveguide and SPP modes.

In addition, waveguide light can be extracted by inserting a planar grid layer consisting of two transparent materials with different refractive indices between the transparent anode and waveguide layer (called a sub-anode grid, see FIG. 12). Also, outcoupling by this grid (whose spacing is significantly greater than a wavelength) has minimal impact on wavelength and viewing angle. By positioning the grid outside of the OLED's active region, this approach allows for complete freedom in varying its dimensions and materials without impacting the optical and electrical characteristics of the OLED.

The sub-anode grid can extract nearly all optical power but SPPs without distortion of the original spectrum of the dopant emitters, and the light extraction efficiency can reach ~70%. Moreover, good white color balance and high light extraction efficiency can be attained at electron transport layer (ETL) thicknesses of 130 nm or 260 nm, where the efficiency of each phosphor is comparable. The SPPs can be decoupled by using thick, conductivity-doped ETLs to achieve high luminance efficiency even at ETL thicknesses approaching 260 nm. The preferred ETL thickness is at least 30 nm. In other embodiments, the ETL can have a thickness of at least 50 nm, 75 nm, 100 nm, 125 nm, 150 nm, 175 nm, or at least 200 nm. Organic dopants such as Li-quinoline (Liq) and Li doped into Alq3 are both known for reducing layer resistance. The thick ETL is shown to be helpful in reducing shorts, and hence increasing device yield for large area PHOLEDs.

Random Corrugated Structure

A random corrugated structure can be replicated or carry through to subsequent deposited active region layers the OLED body, and thus introduce roughness to each of the layer interfaces. This texture does not change the photon state density in the active region and, thus, the emission spectrum is not distorted, and the power distribution is comparable to a conventional device. The resulting active region is essentially a waveguide structure. The generated photons trapped in the waveguided mode are extracted out of the active region by the bends and the structural interruptions at the layer interfaces produced by the random corrugation texture in the waveguide structure. Moreover, corrugations at the cathode surface scatter the power in the waveguide mode as well as prevent coupling to SPPs. By incorporating the random corrugation in the active region light extraction efficiency can be improved by as much as 40% or even as high as 70%.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include billboards, lights for interior or exterior illumination and/or signaling, heads-up displays, fully or partially transparent displays, flexible displays, vehicles, a large area wall, theater or stadium screen, a light therapy device, or a sign. Various control mechanisms may be used to control devices fabricated in accordance with the present invention, including passive matrix and active matrix. Many of the devices are intended for use in a temperature range comfortable to humans, such as 18° C. to 30° C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C≡C-C_nH_{2n+1}$, $Ar_1$, $Ar_1-Ar_2$, and $C_mH_{2n}-Ar_1$, or the host has no substitutions. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example a Zn containing inorganic material e.g. ZnS.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. Application Publication No. 2019/0081248, which is hereby incorporated by reference in its entirety), triplet-triplet annihilation, or combinations of these processes. In some embodiments, the emissive dopant can be a racemic mixture, or can be enriched in one enantiomer.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

EXPERIMENTAL

Substrate Preparation.

The PTFE reflector (Spectralex, Lake-Photonics GmbH) was exposed to UV-ozone for 20 min prior to coating of a high refractive index polymer (NOA 170, Norland Products, Inc.) waveguide onto the PTFE reflector surface. A flat (root mean square roughness<0.5 nm) polydimethylsiloxane (PDMS) stamp attached onto a glass handle was pressed onto the polymer on the diffuser surface for planarization, during which it was exposed to UV light for 220 s prior to stamp removal. In the mirrored comparison OLED The metal mirror substrate was fabricated by depositing a 100 nm thick Al mirror on a glass substrate followed by spin coating the same polymer waveguide at 3000 rpm on its surface. The polymer was then exposed to UV light as above.

Device Fabrication.

A 50 nm thick ITO cathode (bottom electrode) was deposited on the smooth polymer surface using Ar plasma sputter deposition at 5 mTorr. The active regions of the phosphorescent OLED body were grown by vacuum thermal evaporation at a base pressure of $10^{-7}$ torr. The green PHOLED comprised bathophenanthroline (BPhen):Li 20 nm/BPhen 40 nm/4,4'-bis(N-carbazolyl)-1,1'-biphenyl (CBP): bis(2-phenylpyridine) (acetylacetonate) Ir(III) (Irppy$_2$acac) 30 nm/4,4'-cyclohexylidenebis [N,N-bis(4-methylphenyl)benzenamine] (TAPC) 60 nm/TAPC:MoO$_3$ 30 nm. This was capped with a sputter deposited, 50 nm thick top ITO anode using similar conditions as the cathode. The same OLED body structure was simultaneously deposited on the metal mirror (comparative device) and diffuse reflector (inventive device) to eliminate any process distinctions in the making of the two PHOLEDs.

The white PHOLED body comprised BPhen: Li 40 nm/3, 3',5,5'-tetra[(m-pyridyl)-phen-3-yl]biphenyl (BP4mPy) 15 nm/CBP: bis[2-(4,6-difluorophenyl)pyridinato-C2,N] (picolinato)Ir(III) (FIrpic) 10 nm/CBP:Irppy$_2$acac: bis(2-methyldibenzoquinoxaline) (acetylacetonate)Ir (III) (IrMDQ$_2$acac) 15 nm/TAPC 20 nm/TAPC: MoO$_3$ 30 nm/thick ITO 50 nm. The devices were patterned using a shadow mask of an array of 1 mm strips, resulting in a crossbar of top and bottom ITO contacts that defined the 1 mm×1 mm device active area. Again, the same white OLED body structure was simultaneously deposited on the metal mirror (comparative device) and diffuse reflector (inventive device) to eliminate any process distinctions in the making of the two white OLEDs.

Device and Reflector Characterization.

The current density-voltage characteristics of the PHOLEDs were measured using a parameter analyzer (HP4145, Hewlett-Packard) and a calibrated photodiode (S3584-08, Hamamatsu Photonics) following standard procedures[31]. The emission spectra at J=10 mA·cm$^{-2}$ were measured using a calibrated spectrometer (USB2000, Ocean Optics, Inc) connected to the device via an optical fiber (P400-5-UV-VIS, Ocean Optics, Inc.). The reflectance from the PTFE diffuse reflector was measured in an integrating sphere. A calibrated spectrometer was used to measure spectrum of the excitation light source (OSL1, Fiber Illuminator, Thorlabs, Inc.) connected to the integrating sphere with and without the sample present. The spectra were compared to obtain the sample reflectance. Angle-dependent emission spectra and were measured by placing the substrate perpendicular to the plane of detection, and positioning the detector on a motorized rotational stage.

Device Simulation.

The modal power distribution of the PHOLED was calculated based on Green's function analysis. See, Baldo, M. A.; et al., "Simplified Calculation of Dipole Energy Transport in a Multilayer Stack Using Dyadic Green's Functions" in *Opt. Express* 2007, 15 (4), 1762-1772; and Chance, R. R.; et al., "*Lifetime of an Emitting Molecule near a Partially Reflecting Surface*" in *J. Chem. Phys.* 1974, 60 (7), 2744-2748. The device structure used for the simulation is: ITO 50 nm/BPhen 60 nm/CBP 30 nm (Active Layer)/TAPC 90 nm/ITO 50 nm/waveguide layer. We used the refractive indices at $\lambda$=530 nm, corresponding to the peak wavelength for Irppy$_2$acac emission. The dipole orientation of Irppy$_2$acac ($\theta$=0.23), was included in the simulations and the emitter location was assumed to be in the center of the EML. The 16% electrical loss in internal quantum efficiency, obtained from the fit of the top emission from the OLED on the sapphire substrate. The light within the substrate was calculated using the Monte Carlo ray tracing method. Calculation details are included in Fig. S3. Refractive indices for all materials were measured using variable-angle spectroscopic ellipsometry.

Optical Simulation: Dyadic Green's Function

Figure 13:
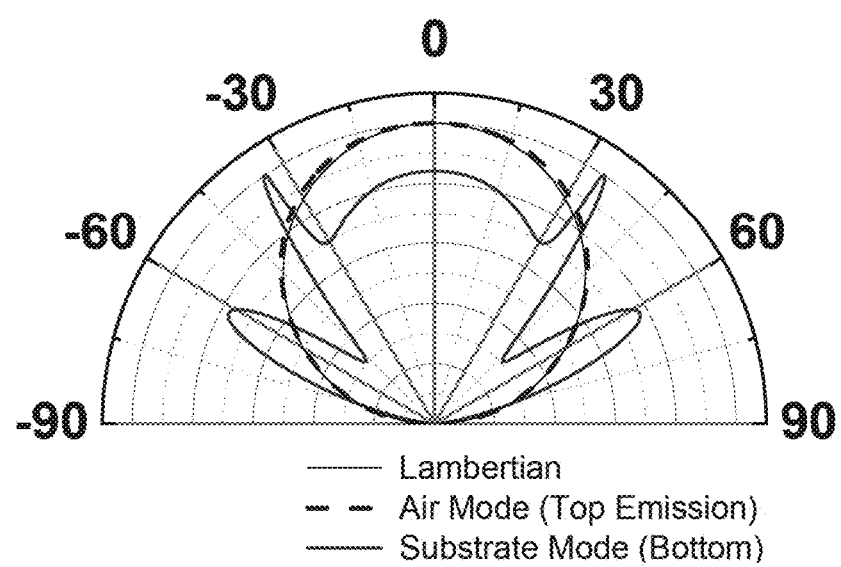
FIG. 13 shows an angular intensity profile of an OLED as disclosed herein.

We calculated the modal power distribution in the OLED via dyadic Green's function analysis. The PHOLED structure used for the calculation is as below. The use of Green's function analysis has two purposes: to calculate the modal power distribution to each mode, and to obtain angular intensity profile for top and bottom emission from the OLED to utilize as the initial light source of the ray tracing simulation. The angular intensity profile is shown in FIG. 13.

Ray Tracing and Transfer Matrix Approaches

The ray tracing program calculates recursive reflection and propagation until the initial ray attenuates to less than the cut-off limit (here we ignore the ray once its power reaches an intensity less than $5\times10^{-3}$ of the initial ray). Emitted rays may experience four events:

1. Reflection from the diffuse reflector surface
2. Transmission/reflection at the planarization layer-air interface
3. Loss at the substrate edges
4. Attenuation to below the cut-off limit Rays originate according to the angular intensity profile calculated via Green's function analysis over the device active area. Rays incident on the diffuse surface are reflected at a random angle with probability given by Lambert's cosine law. Reflection losses at the diffuse reflector are taken into account. During propagation through the planarization layer, the ray is attenuated following the Beer-Lambert law. We calculate the spatial distribution of transmitted power in the air 50 µm above the planarization layer. Transmitted ray intensities are binned within a 50 µm square grid, corresponding to the 50 µm collection fiber core.

The transfer matrix method as utilized to determine the transmission, reflection and absorption (TRA) of the light incident within the OLED active area. See, Forrest, S. R.; et al., "*Small Molecular Weight Organic Thin-Film Photodetectors and Solar Cells*" in *J. Appl. Phys.* 2003, 93 (7), 3693-3723. The TRA results were then inserted into the ray tracing calculations to determine the emission profile of the devices.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A top-emitting organic light emitting device (OLED) comprising:
   a substrate having an inward side and an outward side;
   a non-metallic, diffuse reflective layer with a roughened top surface and a bottom surface disposed over the substrate with the roughened top surface disposed over the bottom surface;
   a high refractive index waveguide layer disposed over the reflective layer; and
   an OLED body disposed over the reflective layer, the OLED body comprising:
      a transparent bottom electrode disposed over high refractive index waveguide layer,
      an organic emissive layer disposed over the transparent bottom electrode, and
      a transparent top electrode disposed over the organic emissive layer;
   wherein a majority of light emitted by the OLED during operation is emitted through the transparent top electrode.

2. The OLED of claim 1, wherein the roughened top surface of the diffuse reflective layer has a root-mean-square roughness in a range from 1.0 µm to 25 µm.

3. The OLED of claim 1, further comprising a microlens array disposed over the top transparent electrode.

4. The OLED of claim 1, wherein the bottom electrode is an anode and the top electrode in a cathode, and the anode and cathode are the same material.

5. The OLED of claim 1, wherein the diffuse reflective layer is selected from polytetrafluoroethylene (PTFE), polyethylene terephthalate (PET), and barium sulfate.

6. The OLED of claim 1, wherein the diffuse reflective layer is positioned at a distance of at least 100 nm from the organic emissive layer.

7. The OLED of claim 1, wherein the high refractive index waveguide layer is a polymer with a refractive index in a range from 1.6 to 2.1.

8. The OLED of claim 1, wherein the inside of the substrate is corrugated with a pattern of corrugation and the pattern of corrugation extends to the diffuse reflective layer.

9. The OLED of claim 1, wherein the light emitted from the device top-emitting OLED has a narrow emission spectrum of less than 40 nm fwhh, and the peak emissive wavelength provides a distinct color selected from blue, green, yellow, orange, or red.

10. The OLED of claim 3, wherein the microlens array is in direct physical contact with the top transparent electrode.

11. The OLED of claim 1, wherein the OLED body is in direct physical contact with the waveguide layer.

12. The OLED of claim 11, wherein the reflective layer is in direct physical contact with the substrate.

13. The OLED of claim 1, wherein the reflective layer is in direct physical contact with the substrate and the waveguide layer.

14. The OLED of claim 1, wherein the substrate is corrugated.

15. The OLED of claim 14, wherein the emissive layer is corrugated with a structure caused by a structure of corrugation of the substrate.

16. The OLED of claim 14, wherein the substrate has a random corrugated structure.

17. The OLED of claim 16, wherein the emissive layer is corrugated with a structure caused by a structure of corrugation of the substrate.

* * * * *